United States Patent
Lee et al.

(10) Patent No.: US 8,011,378 B2
(45) Date of Patent: Sep. 6, 2011

(54) MEGASONIC CLEANING MODULE

(75) Inventors: Yang-lae Lee, Daejeon (KR); Eui-su Lim, Daejeon (KR); Hyun-se Kim, Seoul (KR)

(73) Assignee: Korea Institute of Machinery & Materials, Daejeon (KR)

( * ) Notice: Subject to any disclaimer, the term of this patent is extended or adjusted under 35 U.S.C. 154(b) by 226 days.

(21) Appl. No.: 12/440,830

(22) PCT Filed: Aug. 13, 2007

(86) PCT No.: PCT/KR2007/003876
§ 371 (c)(1),
(2), (4) Date: Mar. 11, 2009

(87) PCT Pub. No.: WO2008/048001
PCT Pub. Date: Apr. 24, 2008

(65) Prior Publication Data
US 2009/0277483 A1    Nov. 12, 2009

(30) Foreign Application Priority Data

Oct. 20, 2006    (KR) .................. 10-2006-0102510

(51) Int. Cl.
*B08B 3/10*    (2006.01)
(52) U.S. Cl. ........................ 134/184; 134/902
(58) Field of Classification Search .......... 134/184, 134/186; 68/3 SS
See application file for complete search history.

(56) References Cited

U.S. PATENT DOCUMENTS

| | | | |
|---|---|---|---|
| 2,921,372 A * | 1/1960 | Bodine, Jr. ............ 433/119 |
| 3,437,952 A * | 4/1969 | Inaba et al. ............ 372/14 |
| 5,047,043 A * | 9/1991 | Kubota et al. ............ 606/169 |
| 5,205,817 A * | 4/1993 | Idemoto et al. ............ 604/22 |
| 5,441,062 A * | 8/1995 | Nogues ............ 134/122 R |
| D369,307 S * | 4/1996 | Imling et al. ............ D10/78 |
| 5,906,687 A * | 5/1999 | Masui et al. ............ 134/1.3 |
| 6,039,059 A * | 3/2000 | Bran ............ 134/105 |
| 6,266,836 B1 * | 7/2001 | Gallego Juarez et al. ........ 8/151 |
| 6,312,256 B1 * | 11/2001 | Dieras et al. ............ 433/119 |
| 6,946,399 B1 * | 9/2005 | Lorimer ............ 438/704 |
| 7,004,182 B2 * | 2/2006 | Duval et al. ............ 134/184 |
| 7,493,781 B2 * | 2/2009 | Ooe ............ 68/3 SS |
| 2006/0130871 A1 * | 6/2006 | Hwang et al. ............ 134/1 |

FOREIGN PATENT DOCUMENTS

| | | | |
|---|---|---|---|
| DE | 20 65 681 | * | 3/1975 |
| JP | 61-148821 A | | 7/1986 |
| JP | 02-032525 A | | 2/1990 |
| JP | 11-345796 A | | 12/1999 |
| SU | 1018818 | * | 5/1983 |

OTHER PUBLICATIONS

International Search Report of International Application No. PCT/KR2007/003876 filed on Aug. 13, 2007.

* cited by examiner

*Primary Examiner* — Frankie L Stinson
(74) *Attorney, Agent, or Firm* — Kile Park Goekjian Reed & McManus PLLC

(57) ABSTRACT

Disclosed herein is a megasonic cleaning module. The megasonic cleaning module includes a vibrator having a piezoelectric element mounted therein for generating ultrasonic waves by the vibration of the piezoelectric element, a first vibratory rod having a diameter gradually decreased to concentrate the longitudinal ultrasonic waves generated from the vibrator, and a second vibratory rod for progressing the longitudinal ultrasonic waves, generated from the first vibratory rod, in the transverse direction. The size of the second vibratory rod at one side thereof where the second vibratory rod is coupled to the first vibratory rod is less than that of the second vibratory rod at the other side thereof, with the result that the longitudinal ultrasonic waves are not prevented from affecting the wafer.

8 Claims, 5 Drawing Sheets

MEGASONIC CLEANING MODULE

BACKGROUND OF THE INVENTION

1. Field of the Invention

The present invention relates to a megasonic cleaning module, and, more particularly, to a megasonic cleaning module including a vibrator having a piezoelectric element, to which power is supplied from a power supply unit, mounted therein for generating ultrasonic waves by the vibration of the piezoelectric element, a first vibratory rod coupled to one side of the vibrator such that the first vibratory rod is vertically located above one major surface of a semiconductor wafer to be cleaned, the first vibratory rod having a diameter gradually decreased to concentrate the longitudinal ultrasonic waves generated from the vibrator, and a second vibratory rod coupled to the first vibratory rod, such that the second vibratory rod is perpendicular to the first vibratory rod, for progressing the longitudinal ultrasonic waves, generated from the first vibratory rod, in the transverse direction, wherein the size of the second vibratory rod at one side thereof where the second vibratory rod is coupled to the first vibratory rod is less than that of the second vibratory rod at the other side thereof, with the result that the longitudinal ultrasonic waves are not prevented from affecting the wafer, and the second vibratory rod has various sectional shapes at the other side thereof, thereby effectively separating foreign matter from the wafer using the transverse ultrasonic waves.

2. Description of the Related Art

One of the most fundamental technologies in a semiconductor manufacturing process is a cleaning technology. The semiconductor manufacturing process includes several steps to form the surface of a semiconductor wafer. At the respective steps, various contaminants are generated and attached to both a semiconductor wafer and a semiconductor manufacturing apparatus. For this reason, it is necessary to clean the semiconductor wafer and the semiconductor manufacturing apparatus at predetermined time intervals. Therefore, the cleaning technology is designed to remove several contaminants, generated during the semiconductor manufacturing process, using a physical or chemical method.

The chemical method is to remove the contaminants from the surface of a semiconductor wafer using washing, etching, and an oxidation-reduction reaction. In this case, various chemicals or gases are used. In the chemical method, particles, attached to the surface of the semiconductor wafer, are removed by a pure or chemical cleaning liquid. Organic matter is dissolved by a solvent, is removed by an oxidizing acid, or is carbonized by oxygen plasma. According to circumstances, the surface of the semiconductor wafer is partially etched such that a new clean surface portion is exposed to the outside.

The physical method is to separate matter from the surface of the semiconductor wafer using ultrasonic energy, to wipe matter out from the surface of the semiconductor wafer using a brush, or to remove matter from the surface of the semiconductor wafer using high-pressure water. Generally, the physical method is used jointly with the chemical method to accomplish more efficient cleaning.

The ultrasonic cleaning is to remove contaminants from an object to be cleaned by a physical means (ultrasonic waves) and a chemical means (a chemical cleaning liquid) and to prevent the removed contaminants from being attached again to the surface of the object. The physical phenomenon by the ultrasonic waves occurs through a cavitation phenomenon of the ultrasonic waves. The cavitation phenomenon is a phenomenon in which, when ultrasonic energy is transmitted into the liquid, micro air bubbles are generated and extinguished by the pressure of the ultrasonic waves. The cavitation phenomenon is accompanied by high pressure (several tens to hundreds of atmospheric pressure) and high temperature (several hundreds to thousands of degrees).

This phenomenon repeatedly occurs and disappears for an extremely short period of time (one over tens of thousands to one over hundreds of thousands of seconds). By these shock waves, the cleaning is performed even to the invisible inside region of the object soaked in the liquid within a short period of time.

Practically, the stirring effect and thermal effect due to the radiation pressure of the ultrasonic waves cause synergism together with detergent in addition to the impact energy due to the cavitation, with the result that the cleaning efficiency is further improved.

The ultrasonic cleaning is used generally to clean or rinse an object to be cleaned, such as a glass substrate for liquid crystal displays (LCD), a semiconductor wafer, or a magnetic disk for data storage. In a general ultrasonic cleaning system, an object to be cleaned is introduced into a cleaning tub containing cleaning liquid, to which ultrasonic waves are applied from a vibratory plate actuated by an ultrasonic vibrator. The ultrasonic waves apply vibratory energy to particles on the object such that the particles and other contaminants are effectively removed from the object.

With the recent high integration of a semiconductor device, a pattern, which will be formed on a wafer, becomes very small. As a result, the pattern on the wafer causes the defect of the semiconductor device due to even micro particles. Consequently, the importance of the cleaning process is being more and more highlighted.

Generally, the wafer cleaning is carried out using ultra pure water (cleaning liquid), a brush, and ultrasonic waves.

FIG. 1 is a view illustrating the structure of a conventional ultrasonic apparatus for cleaning a semiconductor. The conventional ultrasonic cleaning apparatus cleans the surface of a semiconductor wafer 105 using ultrasonic waves and cleaning water (or cleaning liquid). The ultrasonic cleaning apparatus includes a cleaning water sprayer 106, the lower end of which is formed in the shape of a nozzle. Cleaning water 103 is supplied into the cleaning water sprayer 106 through a supply pipe 102 connected to one side of the cleaning water sprayer 106.

When the cleaning water 103 is introduced into the cleaning water sprayer 106 through the supply pipe 102, ultrasonic waves are generated from a vibration unit 101. As a result, the cleaning water 103, carrying the ultrasonic waves, is sprayed to an object to be cleaned, which is located below the cleaning water sprayer 106. At this time, the object is rotated by a rotary shaft 104. Consequently, the surface of the object is cleaned.

In the conventional ultrasonic cleaning apparatus, however, the cleaning water 103, carrying the ultrasonic waves, is sprayed from the single cleaning water sprayer 106. As a result, the cleaning efficiency is low although the cleaning water 103 is excessively consumed.

Also, the intensity of the ultrasonic waves is greatly changed due to instantaneous fluctuation of the cleaning conditions, such as the operational frequency, the condition of the cleaning water, the power consumption, and the cooling condition, during the cleaning process. Furthermore, the high-pressure cleaning water is sprayed through the nozzle structure, with the result that the surface of the semiconductor wafer is locally or entirely damaged.

FIG. 2 is a view illustrating the structure of another conventional ultrasonic cleaning apparatus for cleaning a semiconductor using a vibratory rod. The conventional ultrasonic cleaning apparatus includes a vibratory rod 110 protruding forward and arranged such that the vibratory rod 110 is spaced a predetermined gap from a semiconductor wafer 114, which is located below the vibratory rod 110, a vibration unit 111 coupled to the vibratory rod 110 for supplying ultrasonic oscillation energy to the vibratory rod 110, and a cleaning water sprayer 113 for spraying cleaning water 116 into the gap between the vibratory rod 110 and the semiconductor wafer 114.

The conventional ultrasonic cleaning apparatus further includes a rotary plate 112 and a rotary shaft 115 for rotating the semiconductor wafer 114. The semiconductor wafer 114 is placed on the rotary plate 112, and the vibratory rod 110 is located above the semiconductor wafer 114. Consequently, the vibratory rod 110 generates ultrasonic waves in the form of longitudinal waves while the semiconductor wafer 114 is rotated by the rotary plate 112 and the rotary shaft 115, with the result that, when the cleaning water 116 is sprayed to the semiconductor wafer 114, the ultrasonic cleaning is performed to the entire surface of the semiconductor wafer 114.

In the conventional ultrasonic cleaning apparatus for cleaning the semiconductor using the vibratory rod as shown in FIG. 2, however, the vibratory rod 110 is mounted in a cantilever type structure, with the result that the cleaning process is performed only below the axial direction of the vibratory rod 110. Consequently, strength and weakness of the ultrasonic waves occur structurally along the vibratory rod 110, whereby uniform cleaning efficiency is not expected on a wafer having a micro pattern.

SUMMARY OF THE INVENTION

Therefore, the present invention has been made in view of the above problems, and it is an object of the present invention to provide a megasonic cleaning module for cleaning a wafer using ultrasonic waves, the megasonic cleaning module including a first vibratory rod, the diameter of which is gradually decreased to concentrate longitudinal ultrasonic waves, and a second vibratory rod coupled to the first vibratory rod, such that the second vibratory rod is perpendicular to the first vibratory rod, for changing the longitudinal ultrasonic waves, generated from the first vibratory rod, into transverse ultrasonic waves, wherein the megasonic cleaning module is constructed in a structure in which the size of the second vibratory rod at the region where the second vibratory rod is coupled to the first vibratory rod is less than that of the second vibratory rod at the region where the second vibratory rod is not coupled to the first vibratory rod, whereby the longitudinal ultrasonic waves, not the transverse ultrasonic waves, are not prevented from affecting cleaning liquid, and the second vibratory rod at the region where the second vibratory rod is not coupled to the first vibratory rod is constructed in various different shapes, whereby it is possible to effectively separate foreign matter from a wafer.

Additional objects and advantages of the present invention will be set forth in the description which follows and will be obvious from various embodiments of the present invention. Also, the objects and advantages of the present invention may be accomplished by means and combinations recited in the appended claims.

In accordance with the present invention, the above and other objects can be accomplished by the provision of a megasonic cleaning module including a vibrator for generating ultrasonic waves, a first vibratory rod having a diameter gradually decreased to concentrate the ultrasonic waves generated from the vibrator, the first vibratory rod being vertically located above a semiconductor wafer to be cleaned, such that the first vibratory rod is spaced a predetermined distance from one major surface of the semiconductor wafer, for progressing the ultrasonic waves in the longitudinal direction, and a second vibratory rod coupled to one side of the first vibratory rod, such that the second vibratory rod is perpendicular to the first vibratory rod, for progressing the longitudinal ultrasonic waves in the transverse direction on cleaning liquid applied to the surface of the semiconductor wafer to separate foreign matter from the semiconductor wafer, wherein the size of the second vibratory rod at one side thereof where the second vibratory rod is coupled to the first vibratory rod is less than that of the second vibratory rod at the other side thereof, whereby the longitudinal ultrasonic waves are not prevented from affecting the cleaning liquid.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
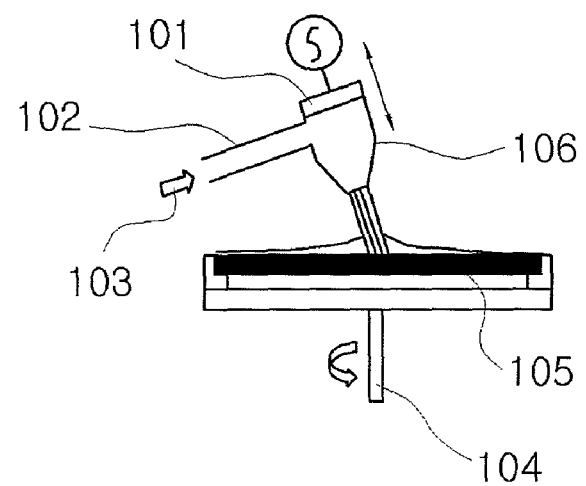
FIG. 1 is a view illustrating the structure of a conventional ultrasonic cleaning apparatus for cleaning a semiconductor using ultrasonic waves and cleaning water.
Figure 2:
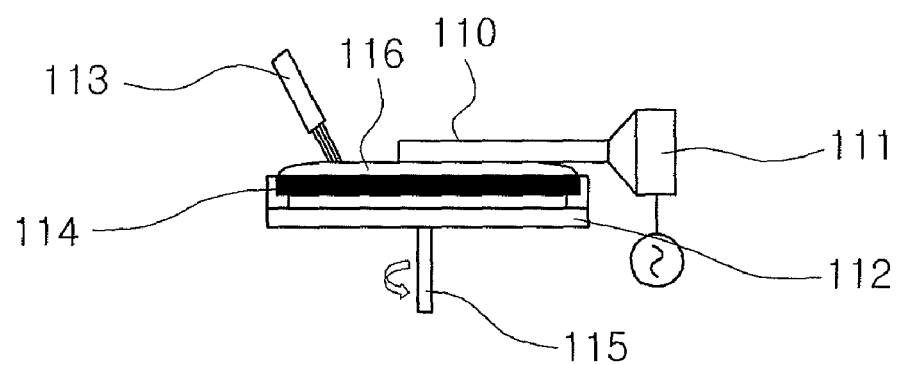
FIG. 2 is a view illustrating the structure of another conventional ultrasonic cleaning apparatus for cleaning a semiconductor using a vibratory rod.

Now, preferred embodiments of the present invention will be described in detail with reference to the accompanying drawings. Here, it should be noted that terms or words, used in the specification and the claims, are not restrictively interpreted as an ordinary and dictionary-based meanings but as meanings and concepts coinciding with the technical idea of the present invention based on a principle that the inventors may properly define the concepts of the terms in order to explain the invention in the best method.

Accordingly, it should be understood that the embodiments described in the specification and the structures illustrated in the accompanying drawings disclose merely some preferred examples of the present invention, but not represent all the technical concepts of the present invention, and therefore, various equivalents and possible modifications thereof that can substitute for the illustrated embodiments of the present invention may exist at the point of time when the present application is filed.

Hereinafter, various megasonic cleaning modules according to preferred embodiments of the present invention will be described in detail with reference to FIGS. 3 to 9.

As shown in the drawings, each megasonic cleaning module according to the present invention is designed to separate foreign matter from a semiconductor wafer 60 to be cleaned using ultrasonic waves 40. Specifically, each megasonic cleaning module concentrates longitudinal ultrasonic waves (longitudinal waves) 21 and converts the longitudinal ultrasonic waves into transverse ultrasonic waves (transverse waves) 31 to effectively clean the semiconductor wafer 60. Each megasonic cleaning module includes a vibrator 10, a first vibratory rod 20, and a second vibratory rod 30.

Figure 3:
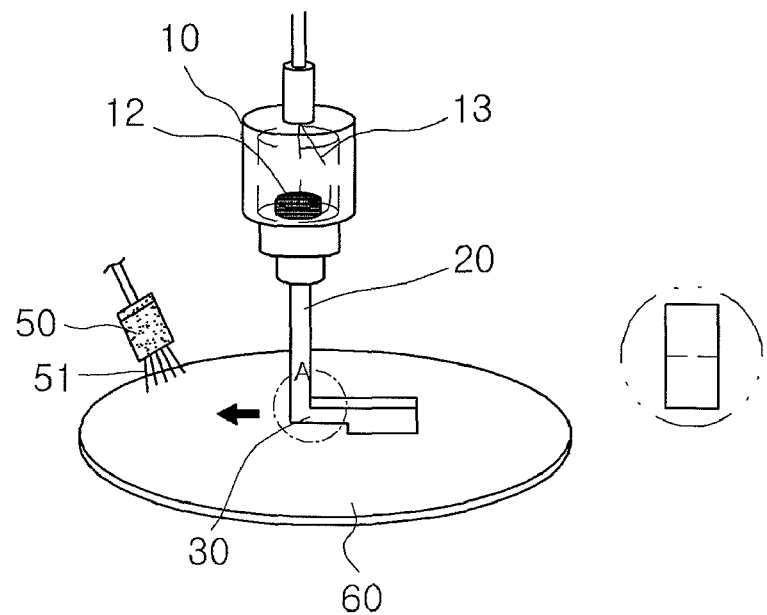
FIG. 3 is a perspective view illustrating a megasonic cleaning module according to a first preferred embodiment of the present invention.

FIG. 3 is a perspective view illustrating a megasonic cleaning module according to a first preferred embodiment of the present invention. As shown in FIG. 3, a piezoelectric element 12 is mounted in the vibrator 10, which generates the ultrasonic waves 40.

The piezoelectric element 12 is connected to a two-ply power cable 13 extending from a power supply unit such that power is supplied to the piezoelectric element 12 from the power supply unit. The piezoelectric element 12 vibrates to generate the ultrasonic waves 40.

The vibrator 10 is vertically located above one major surface of the semiconductor wafer 60 such that the vibrator 10 is spaced a predetermined distance from the semiconductor wafer 60. The vibrator 10 is coupled to the first vibratory rod 20 at a cathode region of the piezoelectric element 12 to progress the ultrasonic waves 40, generated from the vibrator 10, in the longitudinal direction.

The first vibratory rod 20 is constructed in a structure in which the diameter of the first vibratory rod 20 is gradually reduced. The first vibratory rod 20 is vertically located above one major surface of the semiconductor wafer 60 such that the first vibratory rod 20 is spaced a predetermined distance from the semiconductor wafer 60.

The reason why the diameter of the first vibratory rod 20 is gradually reduced is to concentrate the longitudinal ultrasonic waves, generated from the piezoelectric element 12 mounted in the vibrator 10, to a spot.

The second vibratory rod 30 is coupled to the lower end of the first vibratory rod 20, opposite to the semiconductor wafer 60, such that the second vibratory rod 30 is opposite to one major surface of the semiconductor wafer 60 while the second vibratory rod 30 is spaced a predetermined distance from the semiconductor wafer 60. The second vibratory rod 30 is perpendicular to the first vibratory rod 20.

Specifically, one side of the second vibratory rod 30 is coupled to one end of the first vibratory rod 20, such that the longitudinal ultrasonic waves of the first vibratory rod 20 is progressed in the longitudinal direction of the second vibratory rod 30, whereby the ultrasonic waves are progressed in the transverse direction.

Consequently, the megasonic cleaning module according to the present invention achieves more uniform cleaning efficiency than the conventional cleaning apparatus that performs a cleaning operation only in the longitudinal direction during the cleaning of the semiconductor wafer 60. Also, the megasonic cleaning module according to the present invention is applicable to a micro pattern.

Meanwhile, when the longitudinal ultrasonic waves, progressed to the first vibratory rod 20, are transmitted to the second vibratory rod 30, whereby the longitudinal ultrasonic waves are changed into the transverse ultrasonic waves, at the joint between the first vibratory rod 20 and the second vibratory rod 30, the first vibratory rod 20 may affect the semiconductor wafer 60.

In order to solve this problem, the second vibratory rod 30 is constructed in a structure in which the diameter of the second vibratory rod 30 at one side thereof is less than at the other side thereof, and the small-sized side of the second vibratory rod 30 is coupled to the first vibratory rod 20, such that the gap between the other side of the second vibratory rod 30 and the semiconductor wafer 60 is greater than the gap between one side of the second vibratory rod 30 and the semiconductor wafer 60, whereby the effect caused by the longitudinal ultrasonic waves transmitted from the first vibratory rod 20 is reduced.

The first vibratory rod 20 and the second vibratory rod 30 are made of any one selected from solid glass materials, including quartz, sapphire, diamond, and glass carbon. Alternatively, the first vibratory rod 20 and the second vibratory rod 30 may be made of any one selected from metal materials, including stainless steel, titanium, and aluminum, or a metal material coated with a chemical resistant material, such as Teflon.

FIGS. 3 to 9 are perspective views illustrating megasonic cleaning modules according to first to sixth preferred embodiments of the present invention, respectively. These drawings illustrate the shape of the other side of the second vibratory rod 30 for progressing the longitudinal ultrasonic waves, transmitted from the first vibratory rod 20, in the transverse direction and generating uniform ultrasonic waves, i.e., the region of the second vibratory rod 30 where the second vibratory rod 30 is not joined to the first vibratory rod 20.

FIG. 3 is a perspective view illustrating a megasonic cleaning module according to a first preferred embodiment of the present invention. As shown in this drawing, the second vibratory rod 30 has a square, circular, or polygonal section at one side thereof where the second vibratory rod 30 is coupled to the first vibratory rod 20, whereas the second vibratory rod 30 has a rectangular section at the other side thereof. The size of the rectangular section of the second vibratory rod 30 at the other side thereof is greater than that of the square, circular, or polygonal section of the second vibratory rod 30 at one side thereof. The distance between the second vibratory rod 30 and one major surface of the semiconductor wafer 60 is greater at one side of the second vibratory rod 30 than at the other side of the second vibratory rod 30.

Figure 4:
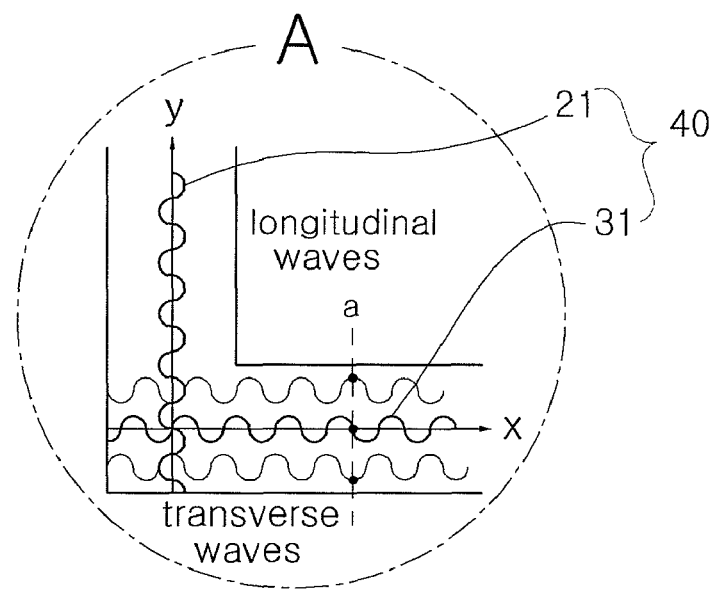
FIG. 4 is an enlarged view illustrating part A of FIG. 3.

FIG. 4 is an enlarged view illustrating part A of FIG. 3. As shown in this drawing, the longitudinal ultrasonic waves (longitudinal waves), progressed to the first vibratory rod 20, are changed in their direction, with the result that the ultrasonic waves are vibrated at the second vibratory rod 30 in the transverse direction, i.e., the transverse ultrasonic waves (transverse waves) are progressed to the second vibratory rod 30.

Points a of FIG. 4 show the occurrence of phase difference. The cleaning is uniformly carried out due to the occurrence of the phase difference.

Figure 5:
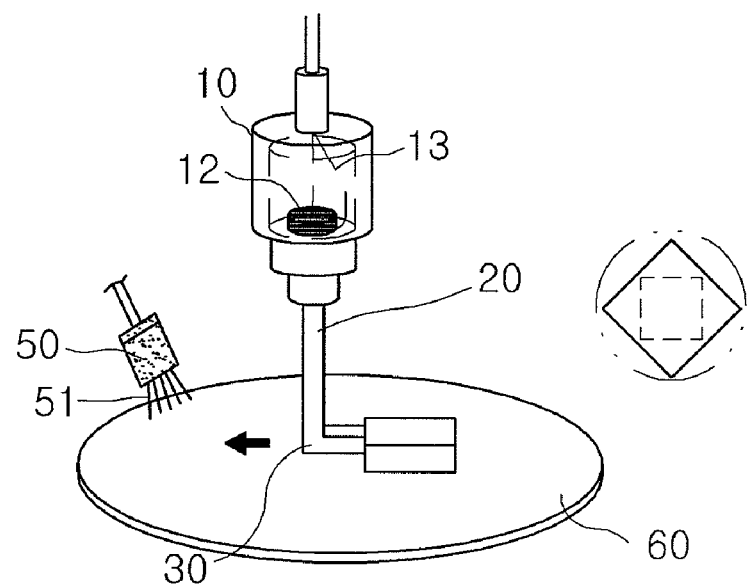
FIG. 5 is a perspective view illustrating a megasonic cleaning module according to a second preferred embodiment of the present invention.

FIG. 5 is a perspective view illustrating a megasonic cleaning module according to a second preferred embodiment of the present invention. As shown in this drawing, the second vibratory rod 30 has a square, circular, or polygonal section at one side thereof where the second vibratory rod 30 is coupled to the first vibratory rod 20, whereas the second vibratory rod 30 has a square diamond section at the other side thereof. The size of the square diamond section of the second vibratory rod 30 at the other side thereof is greater than that of the square, circular, or polygonal section of the second vibratory rod 30 at one side thereof. At this time, the opposite sides of the second vibratory rod 30 are located on the same center line in the longitudinal direction, unlike FIG. 3. As a result, the distance between the second vibratory rod 30 and one major surface of the semiconductor wafer 60, which is to be cleaned, is greater at one side of the second vibratory rod 30 than at the other side of the second vibratory rod 30.

Figure 6:
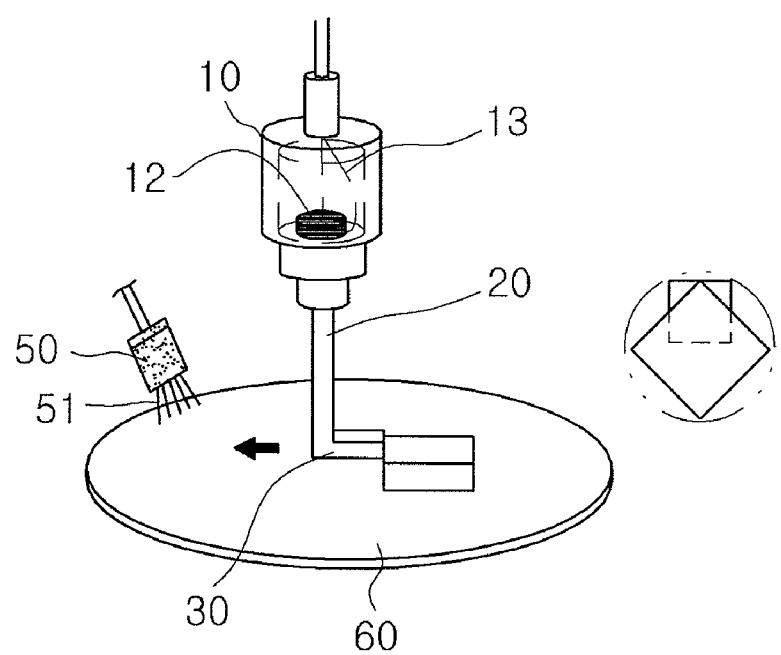
FIG. 6 is a perspective view illustrating a megasonic cleaning module according to a third preferred embodiment of the present invention.

FIG. 6 is a perspective view illustrating a megasonic cleaning module according to a third preferred embodiment of the present invention. As shown in this drawing, the top of the second vibratory rod 30 at one side thereof coincides with that of the second vibratory rod 30 at the other side thereof in the longitudinal direction, unlike FIG. 5 in which the opposite sides of the second vibratory rod 30 are located on the same center line. As a result, the distance between the second vibratory rod 30 and one major surface of the semiconductor wafer 60, which is to be cleaned, is greater at one side of the second vibratory rod 30 than at the other side of the second vibratory rod 30 as compared to FIG. 5.

Figure 7:
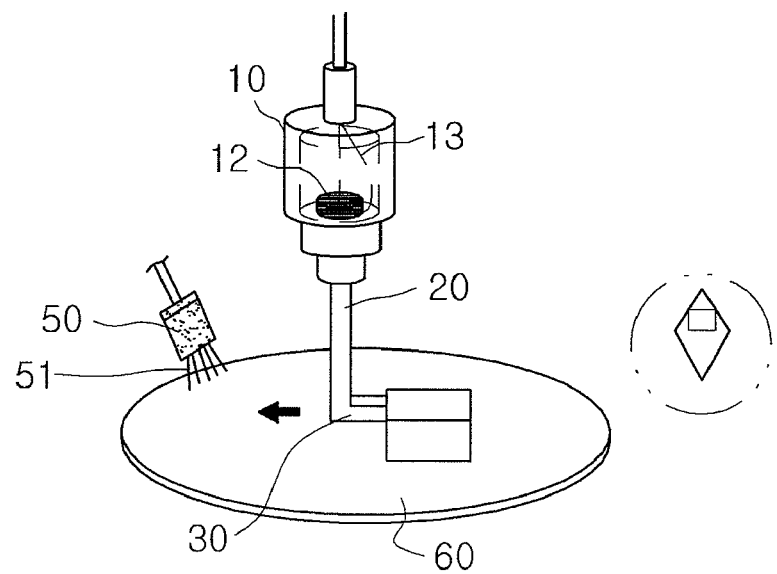
FIG. 7 is a perspective view illustrating a megasonic cleaning module according to a fourth preferred embodiment of the present invention.

FIG. 7 is a perspective view illustrating a megasonic cleaning module according to a fourth preferred embodiment of the present invention. As shown in this drawing, the second vibratory rod 30 has a square, circular, or polygonal section at one side thereof where the second vibratory rod 30 is coupled to the first vibratory rod 20, whereas the second vibratory rod 30 has a non-square diamond section at the other side thereof. The size of the non-square diamond section of the second vibratory rod 30 at the other side thereof is greater than that of the square, circular, or polygonal section of the second vibratory rod 30 at one side thereof. At this time, the opposite sides of the second vibratory rod 30 are located on the same center line in the longitudinal direction.

Figure 8:
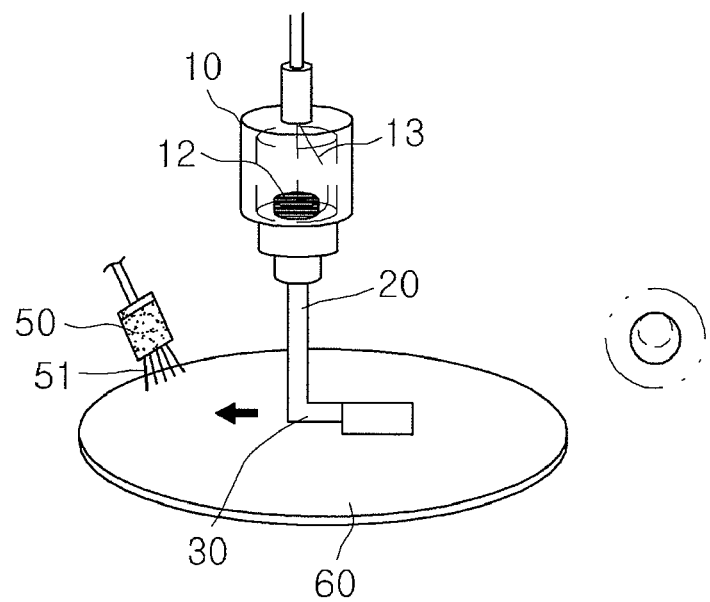
FIG. 8 is a perspective view illustrating a megasonic cleaning module according to a fifth preferred embodiment of the present invention.

FIG. 8 is a perspective view illustrating a megasonic cleaning module according to a fifth preferred embodiment of the present invention. As shown in this drawing, the second vibratory rod 30 has a circular section at one side thereof where the second vibratory rod 30 is coupled to the first vibratory rod 20, and the second vibratory rod 30 also has a circular section at the other side thereof. The diameter of the circular section of the second vibratory rod 30 at the other side thereof is greater than that of the circular section of the second vibratory rod 30 at one side thereof. At this time, the top of the second vibratory rod 30 at one side thereof coincides with that of the second vibratory rod 30 at the other side thereof. As a result, the distance between the second vibratory rod 30 and one major surface of the semiconductor wafer 60 is greater at one side of the second vibratory rod 30 than at the other side of the second vibratory rod 30.

Figure 9:
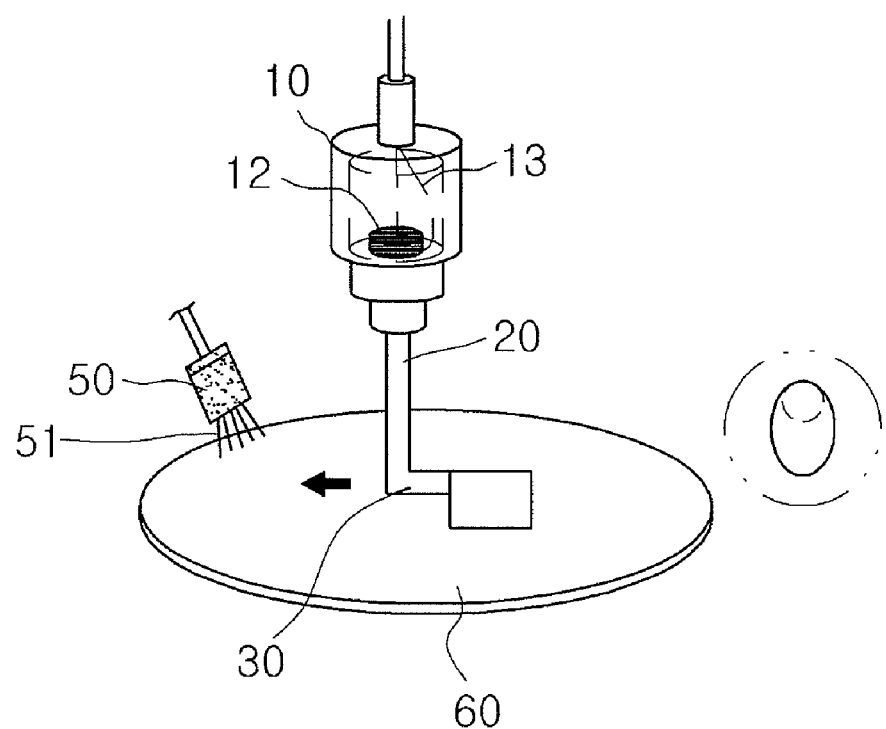
FIG. 9 is a perspective view illustrating a megasonic cleaning module according to a sixth preferred embodiment of the present invention.

FIG. 9 is a perspective view illustrating a megasonic cleaning module according to a sixth preferred embodiment of the present invention. As shown in this drawing, the second vibratory rod 30 has a circular section at one side thereof where the second vibratory rod 30 is coupled to the first vibratory rod 20, whereas the second vibratory rod 30 has an elliptical section at the other side thereof. The size of the elliptical section of the second vibratory rod 30 at the other side thereof is greater than that of the circular section of the second vibratory rod 30 at one side thereof.

In the accompanying drawings, reference numeral 50 indicates a cleaning liquid sprayer.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

As apparent from the above description, the megasonic cleaning module according to the present invention, which cleans a wafer using ultrasonic waves, includes a first vibratory rod, the diameter of which is gradually decreased to concentrate longitudinal ultrasonic waves, and a second vibratory rod coupled to the first vibratory rod, such that the second vibratory rod is perpendicular to the first vibratory rod, for changing the longitudinal ultrasonic waves, generated from the first vibratory rod, into transverse ultrasonic waves. Also, the megasonic cleaning module according to the present invention is constructed in a structure in which the size of the second vibratory rod at the region where the second vibratory rod is coupled to the first vibratory rod is less than that of the second vibratory rod at the region where the second vibratory rod is not coupled to the first vibratory rod. Consequently, the longitudinal ultrasonic waves, not the transverse ultrasonic waves, are prevented from affecting cleaning liquid. Furthermore, the second vibratory rod at the region where the second vibratory rod is not coupled to the first vibratory rod is constructed in various different shapes, and therefore, it is possible to effectively separate foreign matter from a wafer.

What is claimed is:

1. A megasonic cleaning module comprising:
    a vibrator for generating ultrasonic waves;
    a first vibratory rod having a diameter gradually decreased to concentrate the ultrasonic waves generated from the vibrator, the vibrator and first vibratory rod being vertically located above a semiconductor wafer to be cleaned, such that the first vibratory rod is spaced a predetermined distance from one major surface of the semiconductor wafer, for progressing the ultrasonic waves in the longitudinal direction; and
    a second vibratory rod coupled at one end to one side of the first vibratory rod at a distal end thereof, such that the second vibratory rod is perpendicular to the first vibratory rod, for progressing the longitudinal ultrasonic waves in the transverse direction on cleaning liquid applied to the surface of the semiconductor wafer to separate foreign matter from the semiconductor wafer, wherein
    the size of the second vibratory rod at the one end where the second vibratory rod is coupled to the first vibratory rod is less than that of the second vibratory rod at the other end thereof, whereby the longitudinal ultrasonic waves operably impart ultrasonic energy into the cleaning liquid.

2. The megasonic cleaning module according to claim 1, wherein:
    the vibrator has a piezoelectric element, to which power is supplied from a power supply unit, the piezoelectric element being mounted in the vibrator vertically above the first vibratory rod, and the ultrasonic waves are generated by the vibration of the piezoelectric element.

3. The megasonic cleaning module according to claim 1, wherein:
    the first vibratory rod and the second vibratory rod are made of at least one of quartz, sapphire, diamond, and glass carbon.

4. The megasonic cleaning module according to claim 1, wherein:
    the first vibratory rod and the second vibratory rod are made of at least one of stainless steel, titanium, and aluminum, or a metal material coated with a chemical resistant material.

5. The megasonic cleaning module according to claim 1, wherein:
the cross-sectional configuration of the other, free end of the second vibratory rod has approximately a rectangular shape.

6. The megasonic cleaning module according to claim 1, wherein:
the cross-sectional configuration of the other, free end of the second vibratory rod has approximately a diamond shaped.

7. The megasonic cleaning module according to claim 1, wherein:
the cross-sectional configuration of the other, free end of the second vibratory rod has approximately a circular shaped.

8. The megasonic cleaning module according to claim 1, wherein:
the cross-sectional configuration of the other, free end of the second vibratory rod has approximately an oval shaped.

* * * * *